(12) United States Patent
Alptekin et al.

(10) Patent No.: US 10,418,450 B2
(45) Date of Patent: Sep. 17, 2019

(54) SELF ALIGNED REPLACEMENT METAL SOURCE/DRAIN FINFET

(71) Applicant: International Business Machines Corporation, Armonk, NY (US)

(72) Inventors: Emre Alptekin, Fishkill, NY (US); Robert R. Robison, Colchester, VT (US); Reinaldo A Vega, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/136,238

(22) Filed: Apr. 22, 2016

(65) Prior Publication Data

US 2017/0141197 A1 May 18, 2017

Related U.S. Application Data

(62) Division of application No. 14/943,652, filed on Nov. 17, 2015.

(51) Int. Cl.

| H01L 29/417 | (2006.01) |
|---|---|
| H01L 29/66 | (2006.01) |
| H01L 29/40 | (2006.01) |
| H01L 29/06 | (2006.01) |
| H01L 29/45 | (2006.01) |
| H01L 29/78 | (2006.01) |

(52) U.S. Cl.
CPC .... *H01L 29/41791* (2013.01); *H01L 29/0649* (2013.01); *H01L 29/0653* (2013.01); *H01L 29/401* (2013.01); *H01L 29/45* (2013.01); *H01L 29/665* (2013.01); *H01L 29/66545* (2013.01); *H01L 29/66795* (2013.01); *H01L 29/785* (2013.01); *H01L 29/66803* (2013.01)

(58) Field of Classification Search
None
See application file for complete search history.

(56) References Cited

U.S. PATENT DOCUMENTS

| 8,815,693 | B2 | 8/2014 | Alptekin et al. | |
|---|---|---|---|---|
| 8,921,940 | B2* | 12/2014 | Kim | H01L 21/76 257/342 |
| 9,059,290 | B2 | 6/2015 | Alptekin et al. | |
| 2007/0111435 | A1* | 5/2007 | Kim | H01L 29/41791 438/253 |

(Continued)

OTHER PUBLICATIONS

Emre Alptekin et al.,"Self Aligned Replacement Metal Source/Drain Finfet", U.S. Appl. No. 14/943,652, filed Nov. 17, 2015.

(Continued)

*Primary Examiner* — Daniel Whalen
(74) *Attorney, Agent, or Firm* — Cantor Colburn LLP; Steven Meyers

(57) ABSTRACT

A fin-shaped field effect transistor (finFET) device comprising includes a substrate, an insulating layer displaced over the substrate, and a fin. The device also includes a gate formed over the fin, the gate including: a gate stack; and a high-k dielectric on opposing side of the gate stack. The device further includes metallic source and drain regions formed over the fin and on opposing sides of the gate.

2 Claims, 12 Drawing Sheets

(56) References Cited

U.S. PATENT DOCUMENTS

| | | | |
|---|---|---|---|
| 2011/0127611 A1* | 6/2011 | Lee | H01L 29/41791 |
| | | | 257/368 |
| 2014/0061792 A1 | 3/2014 | Bu | |
| 2014/0203370 A1* | 7/2014 | Maeda | H01L 29/785 |
| | | | 257/365 |
| 2014/0353719 A1* | 12/2014 | Kim | H01L 27/0886 |
| | | | 257/192 |
| 2015/0041918 A1* | 2/2015 | Wann | H01L 29/785 |
| | | | 257/401 |
| 2015/0044842 A1* | 2/2015 | Wang | H01L 29/665 |
| | | | 438/296 |

OTHER PUBLICATIONS

List of IBM Patents or Patent Applications Treated as Related; Date Filed: Apr. 22, 2016, p. 1-2.

* cited by examiner

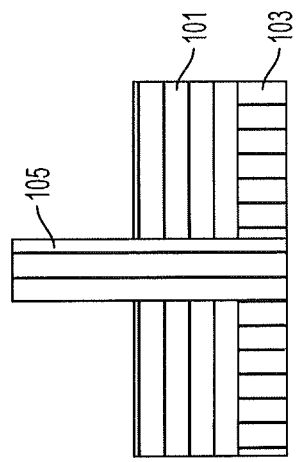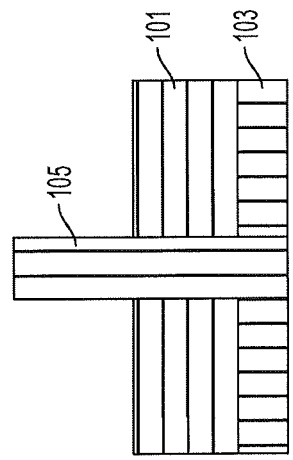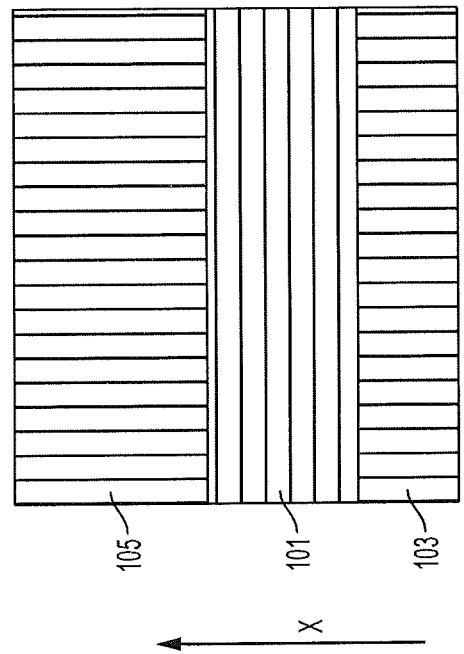

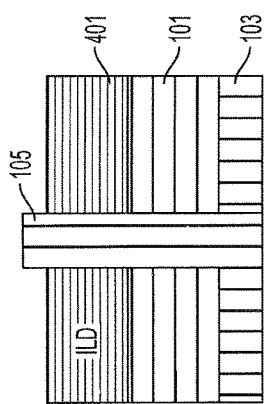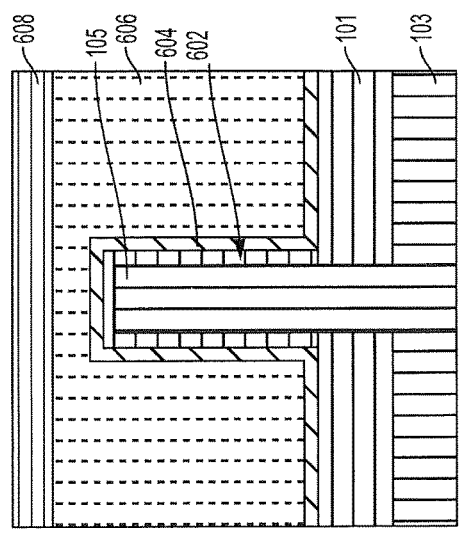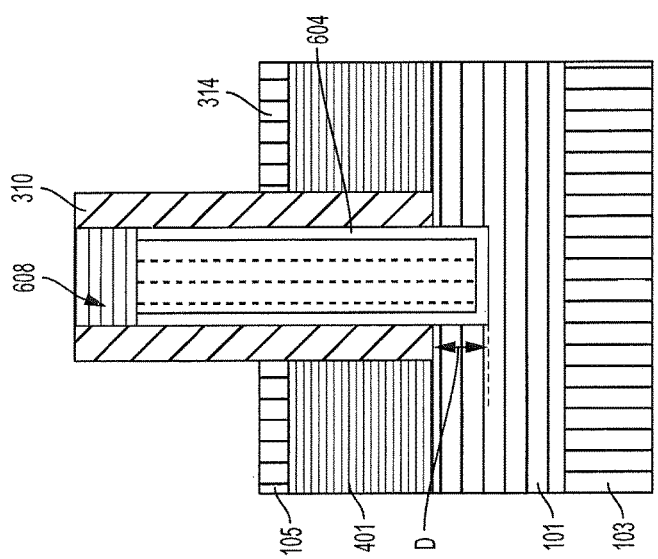

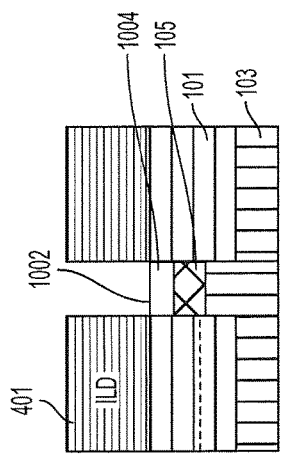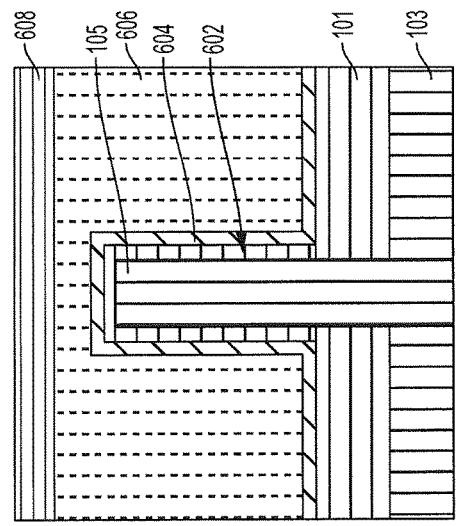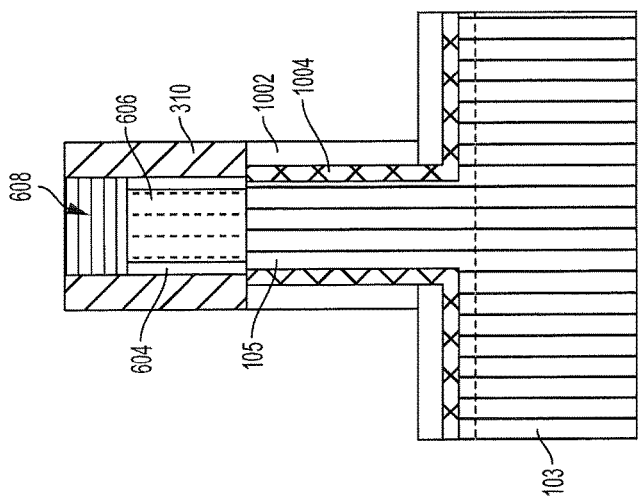
FIG. 10B
FIG. 10C
FIG. 10A

SELF ALIGNED REPLACEMENT METAL SOURCE/DRAIN FINFET

This application claims the benefit of an earlier filing date from U.S. application Ser. No. 14/943,652 filed Nov. 17, 2015, the entire disclosure of which is incorporated herein by reference.

BACKGROUND

The present invention relates generally to semiconductor device processing techniques and, more particularly, to a method of a replacement metal source/drain fin-shaped field effect transistor (finFET).

The escalating demands for high density and performance associated with ultra large scale integrated (ULSI) circuit devices have required certain design features, such as shrinking gate lengths, high reliability and increased manufacturing throughput. The continued reduction of design features has challenged the limitations of conventional fabrication techniques.

SUMMARY

In one embodiment, a method of a fin-shaped field effect transistor (finFET) device is disclosed. The method includes: forming at least one fin that extends in a first direction; covering the fin with a dummy gate stack that extends in a second direction perpendicular to the first direction and that divides the at least one fin into source and drain regions on opposing sides of the replacement gate stack; covering the source and drain regions with an interlayer dielectric; replacing the dummy gate stack with a replacement metal gate stack; performing a first anneal at a first temperature after the replacement metal gate stack has replaced the dummy gate stack. In this method, after performing the first anneal the method further includes: recessing a top portion of the interlayer dielectric; and forming metallic source and drain regions.

In another embodiment, a fin-shaped field effect transistor (finFET) device is disclosed. The device of this embodiment includes a substrate, an insulating layer displaced over the substrate, a fin, and a gate formed over the fin. The gate includes gate includes a gate stack and a high-k dielectric on opposing side of the gate stack. The device also includes metallic source and drain regions formed over the fin and on opposing sides of the gate.

BRIEF DESCRIPTION OF THE SEVERAL VIEWS OF THE DRAWINGS

Referring to the exemplary drawings wherein like elements are numbered alike in the several Figures:

FIGS. 2A-2C shows a second stage of forming a finFET device;

FIGS. 8A-8C shows a first stage of forming metal contacts over the source/drain regions;

FIGS. 10A-10C shows a third stage of forming metal contacts over the source/drain regions.

DETAILED DESCRIPTION

When the gate length of conventional planar metal oxide semiconductor field effect transistors (MOSFETs) is scaled below 100 nm, problems associated with short channel effects (e.g., excessive leakage between the source and drain regions) become increasingly difficult to overcome. In addition, mobility degradation and a number of process issues also make it difficult to scale conventional MOSFETs to include increasingly smaller device features. New device structures are therefore being explored to improve FET performance and allow further device scaling.

Multi-Gate MOSFETs (MuGFETs) represent one type of structure that has been considered as a candidate for succeeding existing planar MOSFETs. In MuGFETs, two or more gates may be used to control short channel effects. A FinFET is a recent MuGFET structure that exhibits good short channel behavior, and includes a channel formed in a vertical fin. The finFET structure may be fabricated using layout and process techniques similar to those used for conventional planar MOSFETs. The FinFET device often includes active source and drain regions and a channel region that are formed from a silicon fin. The channel region is wrapped with gate materials such as polysilicon, metal materials, or high-k materials.

Figure 1A:
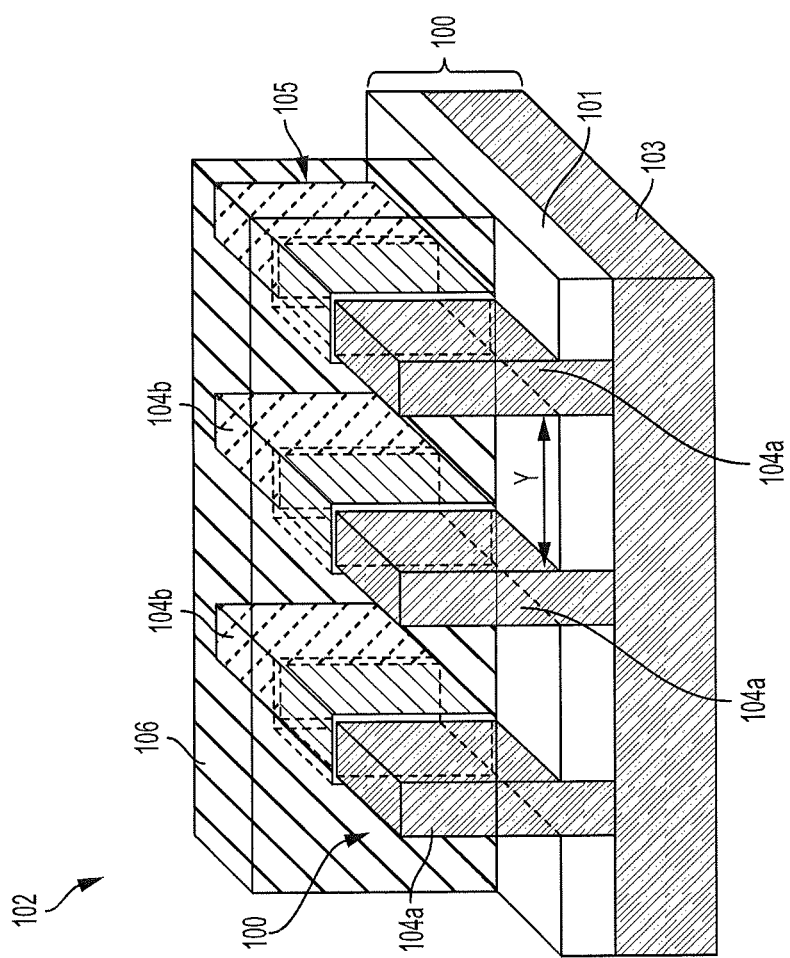
FIG. 1A shows a perspective view of an example of a finFET device.
Figure 1B:
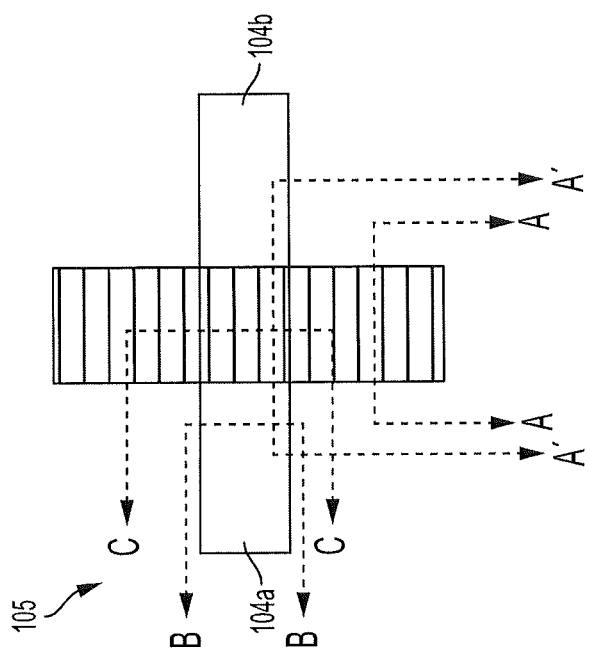
FIG. 1B shows a top view of an example of a finFET device.

FIGS. 1A and 1B illustrate, respectively, perspective and top views of an exemplary arrangement of FinFET devices 102. As shown, a device including three individual FinFETs 105 is illustrated in FIG. 1A and FIG. 1B shows only a single FinFET 105. It shall be understood that a FinFET device having any number of individual FinFET may be formed according to the teachings herein. As illustrated, there are no contacts yet formed on the source and drain.

The FinFET device 102 has individual FinFets 105 that include fin portions 104 that are arranged in parallel and passing through and isolation layer 101 of a substrate 100. The isolation layer 101 may be a shallow trench isolation (STI) layer in one embodiment. In one embodiment, the substrate 101 is a bulk substrate and the fin portions 104 are contiguous with and formed of the same material as the substrate 101.

A gate stack portion 106 is disposed over portions of the fin portions 104. In particular, the fins are shown as having source sides 104a and drain sides 104b. The gate 106 is formed, generally over middle the fins. Application of a voltage to the gate will allow a current to pass from the source side 104a to the drain side 104b (or vice versa).

In some cases it may be beneficial to form metallic source/drain contacts on the source and drain sides 104a, 104b. Such processing may be referred to as metallic source drain (MSD) processing herein. Herein, MSD processing is performed after a replacement metal gate (RMG) processing. The inventors hereof have discovered that such ordering may be required because the RMG process requires a thermal anneal step which is beyond the thermal stability of the silicides which would act as the main candidates for MSD (NiSi, ErSi, PtSi, etc.). In one embodiment, the order of processing may also allow for invoking a gate recess in a MSD device. Such a recess may improve bulk FinFET delay and short channel effects.

The following description will define a process flow by which a FinFET may be formed. In FIG. 1B, four different section lines are shown. In the following figures, those labelled with an "A" are a cross-section taken along line A-A or A'-A', those labelled with a "B" are a cross-section taken along B-B and those labelled with a "C" are a cross-section taken along C-C.

FIGS. 2A-2C shows a first step according to one embodiment and FIG. 2A is taken along line A-A. The device includes a substrate layer 103 with an insulating layer 101 disposed over or directly on it. Herein, the term "over" shall refer to a layer that is disposed further from a substrate layer 103 than another layer (i.e., it if further from the bulk substrate in the "x" direction as labelled in FIG. 2A). The substrate layer 103 includes a fin 105 is formed such that it extends upwardly from the substrate layer 101. The fin 105 and the substrate 103 are formed of the same material in one embodiment. In one embodiment, both the fin 105 and the substrate 103 are formed of a bulk substrate material (e.g., silicon). In practice, the fins may be formed on the substrate layer 103 by etching them out of the substrate layer 103, and then the insulating layer 101 is formed by filling the space between the fins with insulating material, planarizing this material, and then etching this material to reveal a top portion of the fins.

In another embodiment, the substrate layer may be an SOI substrate. In such a case, an insulating layer 101 is formed on top of the SOI substrate (in such a case the insulating layer is called a buried oxide, or BOX, layer) and then another SOI layer is formed over the box layer and the fins are etched out of this "top" SOI layer.

The following description related to FIGS. 3-6 generally describes what is known RMG processing. Certain steps will be generally described but it shall be appreciated that as disclosed herein, performing such RMG processing before forming metallic source/drain contacts may provide certain advantages as described above.

Figure 3B:
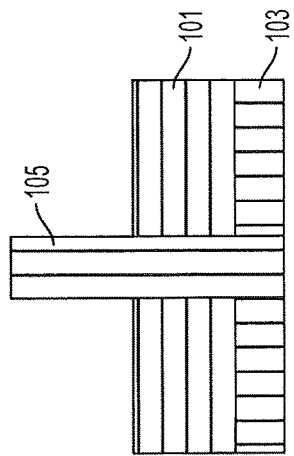
FIGS. 3A-3C shows a third stage of forming a finFET device and includes a step related to the formation of a replacement metal gate (RMG) process.
Figure 3C:
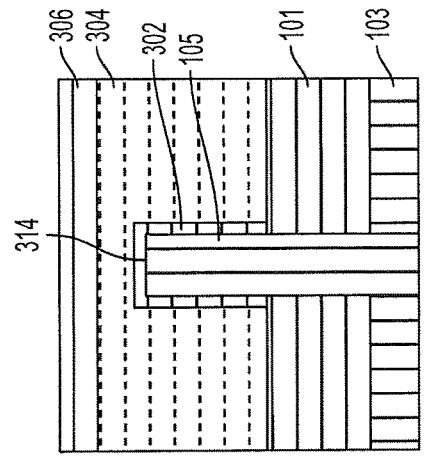
Figure 3A:
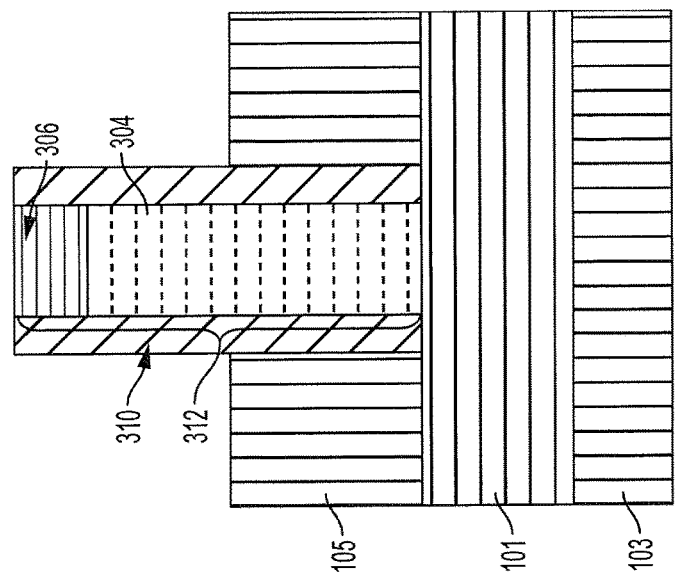

FIGS. 3A-3C shows a next step according to one embodiment and FIG. 3A is taken along line A-A. A dummy gate dielectric 302 may be a deposited or grown oxide layer. The dummy gate dielectric 302 and the insulator 101 are then covered by a dummy gate stack material 304 such as an amorphous silicon. That layer is then covered by a dummy gate cap 306 that may be formed of one or a combination of silicon dioxide, silicon nitride, or amorphous carbon. A pattern may then be etched on the upper surface of the gate cap layer 306 and then a chemical or other process may form a dummy gate stack 312 on to which sidewall spacers may be formed. Formation of the sidewall spacers 310 is within the knowledge of the skilled practitioner. At the end of the processing described in relation to FIGS. 3A-3C a dummy gate stack 312 sandwiched by spacers 310 has been completed. The gate stack 312 is formed as a 3-D element disposed perpendicular to the fin 105 and passes over a top 314 of the fin 105.

Figure 4B:
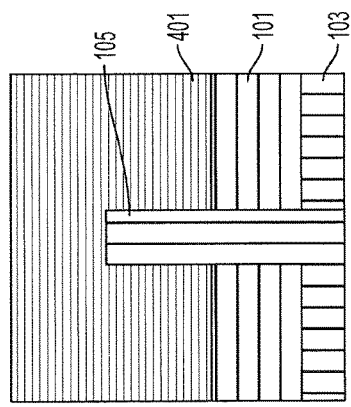
FIGS. 4A-4C shows a fourth stage of forming a finFET device and includes a step related to the formation of a replacement metal gate (RMG) process.
Figure 4C:
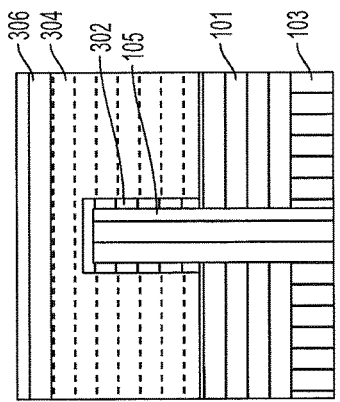
Figure 4A:
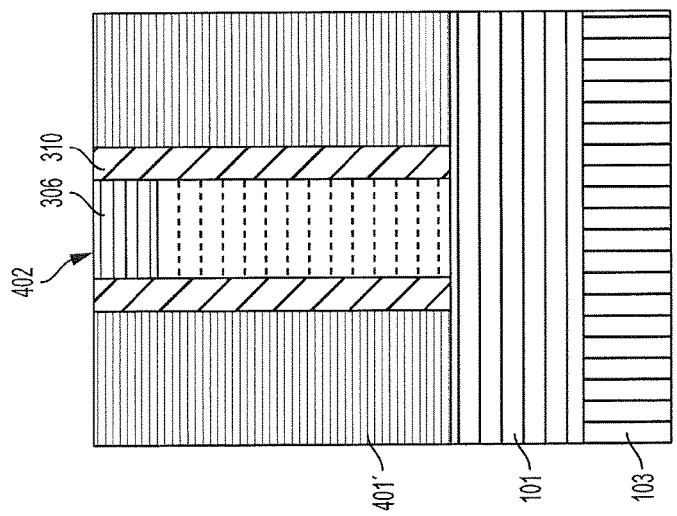

FIGS. 4A-4C shows a next processing step and FIG. 4A is taken along line A-A. In this step, an interlayer dielectric (ILD) 401 is deposited over the entire structure of the FIGS. 3A-3C. Typically, the source and drain regions are doped either before or when the ILD layer 401 is deposited. The ILD layer 401 will serve to cover the source and drain 104a, 104b regions of the fin 104 while the dummy gate 312 is replaced with the actual gate. In FIGS. 4A-4C, the ILD layer 401 is level with a top 402 of the dummy gate cap 306.

Figure 5B:
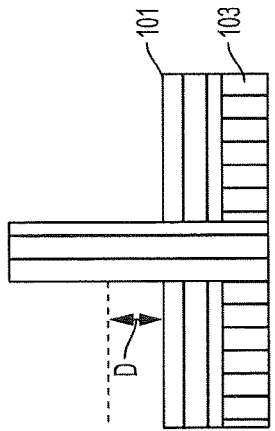
FIGS. 5A-5C shows a fifth stage of forming a finFET device and includes a step related to the formation of a replacement metal gate (RMG) process.
Figure 5C:
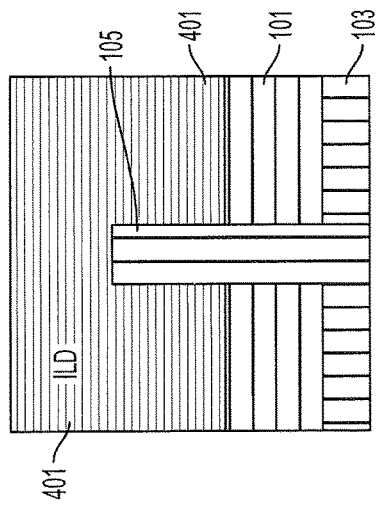
Figure 5A:
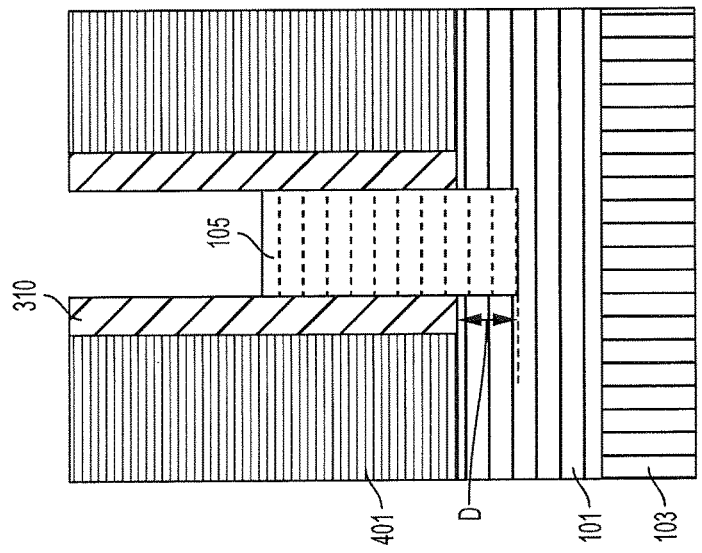

FIGS. 5A-5C shows the structure after a portion the dummy gate stack has been removed. FIG. 5A is taken along line A-A.

In particular, the dummy gate stack has been removed such that original fin 105 is shown has been uncovered (e.g., the dummy gate dielectric 302 and the dummy gate stack material have been removed in a region between the spacers 310. This may be accomplished in known manners. In one embodiment, the insulator 101 may optionally be removed in a region between the spacers 310 by a gate recess depth shown at depth D. The recess may reduce delay and short channel effects.

Figure 6B:
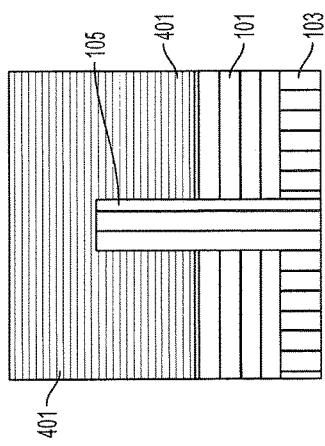
FIGS. 6A-6C shows a sixth stage of forming a finFET device and includes a step related to the formation of a replacement metal gate (RMG) process.
Figure 6C:
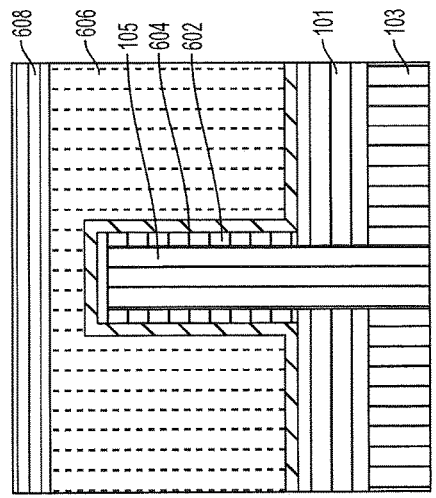
Figure 6A:
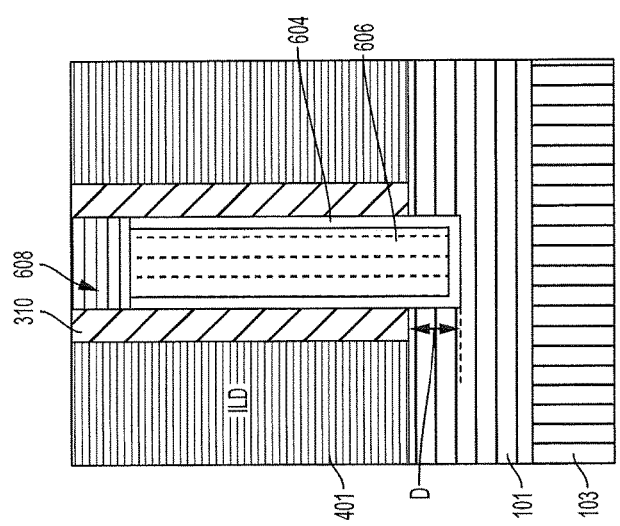

FIGS. 6A-6C shows the finalized gate formed by a RMG processes. In particular, in the region between the spacers 310 has a thin inner layer dielectric layer 602 deposited over the fin 105. Then a high-k dielectric 604 is deposited on or over the thin inner layer dielectric layer 602. This structure is then completed by the addition of gate stack layer 606 and a cap layer 608. The replacement gate stack layer 606 may be formed of one or a combination of workfunction metals (including but not limited to TiN, TiAl, TaN, TiAlC) and a low resistance metal fill (including but not limited to aluminum or tungsten), while the cap layer 608 may comprise one or a combination of silicon dioxide or silicon nitride. Of course, one or more high temperature annealing steps may have also been performed. As discussed above, these anneals may be performed at a temperature that destroys or reduces the effectiveness of metal sources/drains. As such, if the metallic drain/source connections were formed before the RMG processing, the device may not be effective. In FIGS. 6A and 6C it can be seen that the high-k dielectric 604 is formed on opposing sides of the gate stack 606. Such a configuration is typically only found in gates formed by an RMG process.

Figure 7:
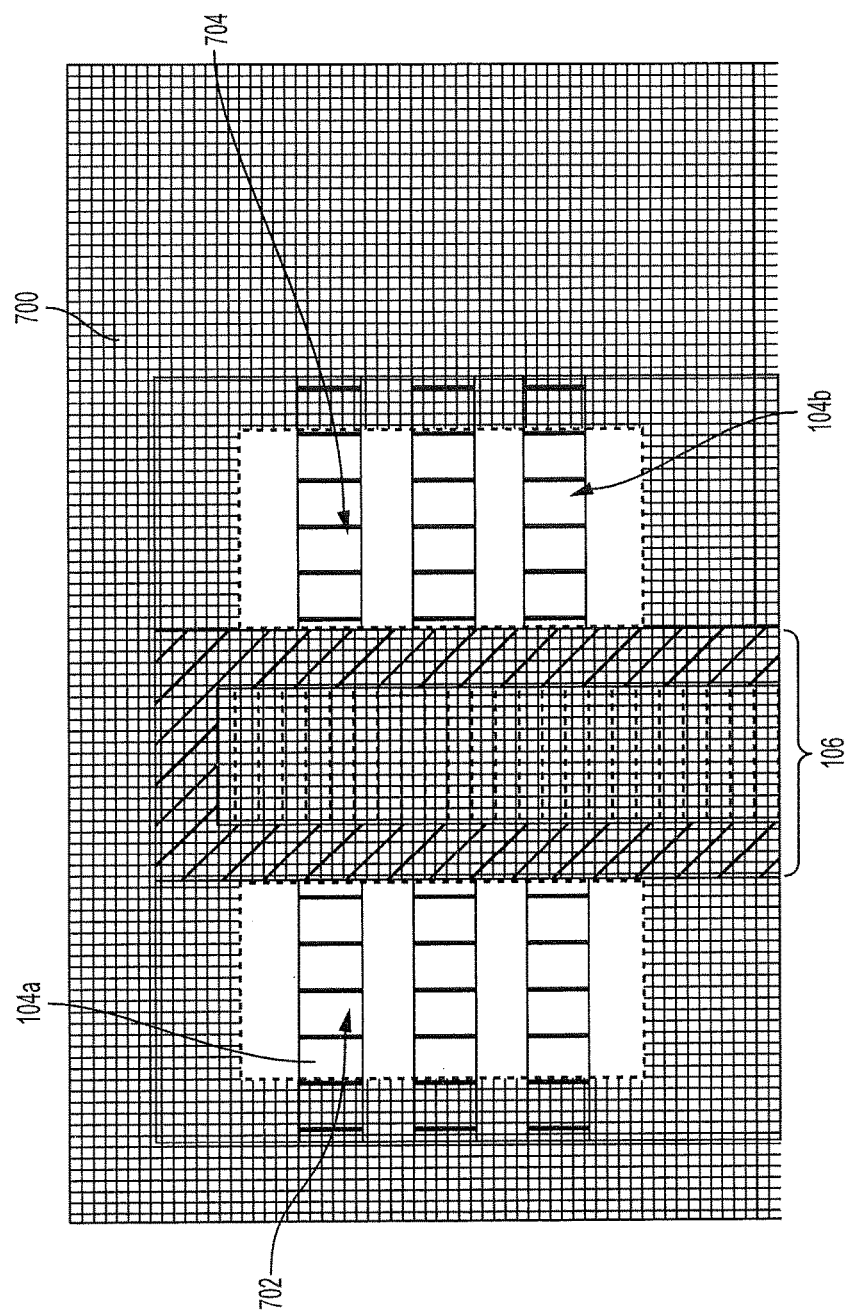
FIG. 7 shows a top view after the stage of FIGS. 6A-6C have been completed and openings have been formed over the source/drain regions of the fins.

FIG. 7 shows a top view of device shown in FIG. 1 after the processing of of FIGS. 6A-6C. In this view, the entire device has been covered by a mask layer 700 with exposed source and drain 702, 704 regions. That is, the source and drain (104a, 104b) are exposed and the gate stack and other regions are covered.

FIGS. 8A-8C shows a next processing step and FIG. 8A is taken along line A-A. In this step, the ILD 401 in a region outside of the spacers 310 is removed to a level slightly below an upper surface (top) 314 of the fin 105.

Figure 9B:
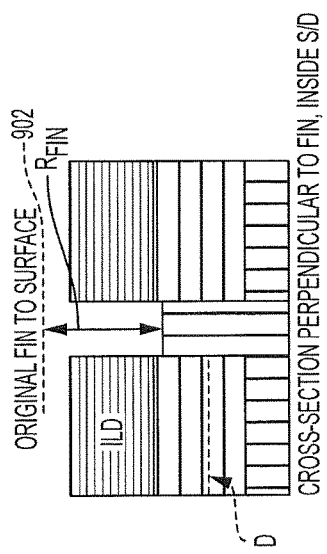
FIGS. 9A-9C shows a second stage of forming metal contacts over the source/drain regions.
Figure 9C:
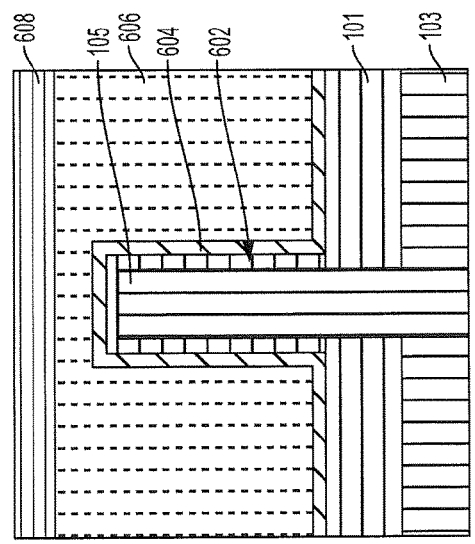
Figure 9A:
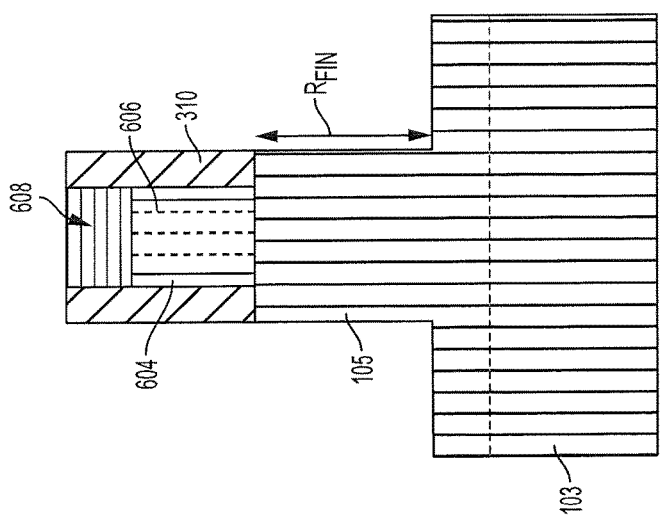

FIGS. 9A-9C shows processing after a fin recess 900 is formed in the fin 105. The depth of the fin recess is shown as $R_{fin}$ with the upper bound being defined as the upper surface 314 (represented by dashed line 902). FIG. 9A and all remaining figures with an A suffix are taken along section lines A'-A' from FIG. 1B.

FIGS. 10A-10C shows the structure after the source/drain have been doped. In one embodiment, a silicide layer 1002 is formed over the fin in the open regions. The layer may be formed with nickel based material being first deposited over the fin 105 and other exposed regions. Other materials may be used to form the silicide layer, such as platinum, erbium, etc. A dopant (shown as region 1004) may then be introduced into the nickel on the top and sides of the fin 105 and annealed. This anneal causes the metal to become the silicide layer 1002 and the dopant to move into the fin 105. Another option is to first dope the fin and then anneal. Then the nickel or other metal is placed and another anneal occurs that results in the formation of the silicide layer 1002 and the dopant region 1004. It shall be noted that the anneals used to form the silicide layer 1002/dopant regions 1004 are much lower than used in the RMG process and do not harm the gate stack. Yet another option is to utilize a so-called implant into silicide (ITS). In such a process, the implant takes place after the silicide has been formed.

Figure 11B:
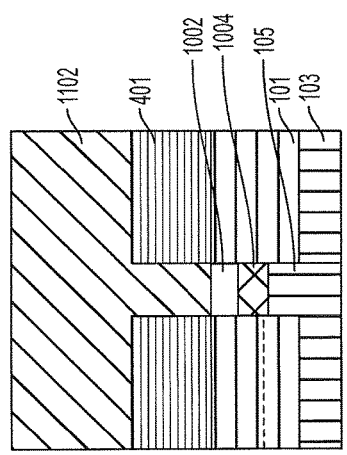
FIGS. 11A-11C shows a fourth stage of forming metal contacts over the source/drain regions.
Figure 11C:
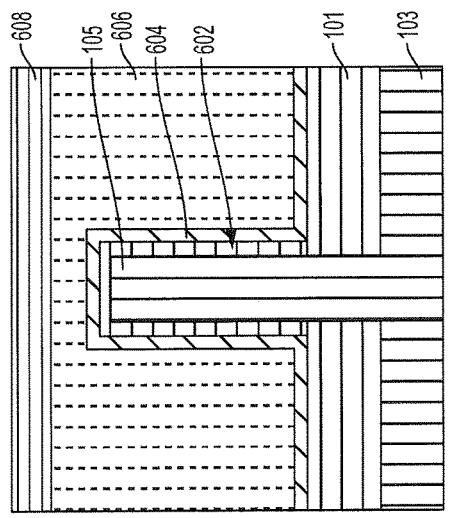
Figure 11A:
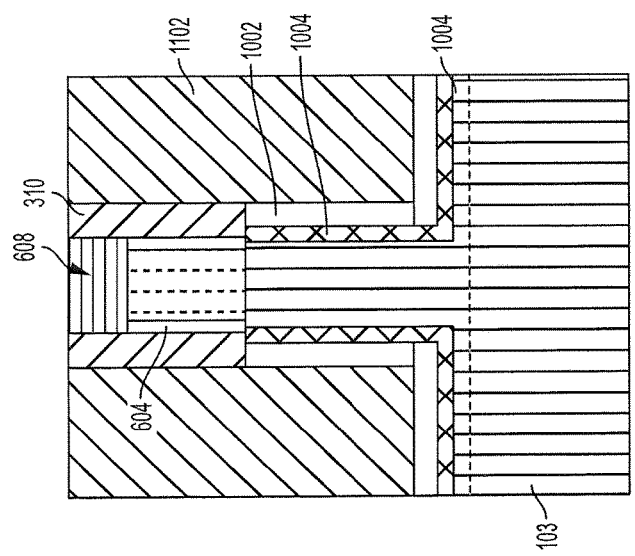

Lastly, the some or all of the open regions 702/704 are filled with a metal source/drain fill material 1102 as shown in FIGS. 11A-11C. The metal source/drain fill material 1102 may be any suitable material such as Al, W, Cu, etc.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A fin-shaped field effect transistor (finFET) device comprising:
   a substrate;
   an insulating layer displaced over the substrate;
   a fin having doped regions comprising an annealed dopant lining vertical sidewalls of the fin and surfaces of the substrate;
   a silicide layer covering the doped regions lining the vertical sidewalls of the fin and the surfaces of the substrate;
   a gate formed over the fin, the gate comprising a gate stack, a discrete inner layer dielectric deposited on opposing sides of the gate stack, a discrete high-k dielectric deposited on the inner layer dielectric, a sidewall spacer arranged on the discrete high-k dielectric, the doped regions having a top surface that is arranged beneath the sidewall spacer;
   an interlayer dielectric (ILD) formed on the insulating layer; and
   metallic source and drain regions, each formed in a recess in the ILD and each directly covering a top surface and the vertical sidewalls of the fin, the metallic source and drain regions on opposing sides of the gate and arranged in contact with the sidewall spacer of the gate.

2. The finFET device of claim 1, wherein the insulating layer is a shallow trench isolation layer and the fin is formed by an extension of the substrate that extends above an upper surface of the shallow trench isolation layer.

* * * * *